United States Patent [19]

Ong et al.

[11] Patent Number: 5,597,625
[45] Date of Patent: Jan. 28, 1997

[54] LOW PRESSURE GROWTH OF CUBIC BORON NITRIDE FILMS

[75] Inventors: Tiong P. Ong, Austin, Tex.; Yuh-Han Shing, Hsinchu, Taiwan

[73] Assignee: California Institute of Technology, Pasadena, Calif.

[21] Appl. No.: 538,258

[22] Filed: Oct. 3, 1995

Related U.S. Application Data

[63] Continuation of Ser. No. 338,281, Nov. 14, 1994, abandoned, which is a continuation of Ser. No. 180,534, Jan. 12, 1994, abandoned, which is a continuation of Ser. No. 16,132, Feb. 10, 1993, abandoned.

[51] Int. Cl.$^6$ .............................. B05D 3/06; C23C 16/00
[52] U.S. Cl. .................... 427/575; 427/571; 427/577; 427/249; 427/255.7; 427/299; 427/309; 51/307
[58] Field of Search .................... 427/575, 577, 427/249, 255.7, 571, 309, 299, 402; 428/408; 423/446; 51/307

[56] References Cited

U.S. PATENT DOCUMENTS

| | | | |
|---|---|---|---|
| 4,734,339 | 3/1988 | Schachner et al. | 428/701 |
| 4,988,421 | 1/1991 | Drawl et al. | 204/192.3 |
| 5,015,528 | 5/1991 | Pinneo | 428/403 |
| 5,082,359 | 1/1992 | Kirkpatrick | 359/642 |
| 5,162,886 | 11/1992 | Nishibayashi et al. | 257/421 |
| 5,164,051 | 11/1992 | Komaki et al. | 204/129.43 |
| 5,264,296 | 11/1993 | Doll et al. | 428/698 |

FOREIGN PATENT DOCUMENTS

| | | |
|---|---|---|
| 57-95881 | 6/1982 | Japan . |
| 63-239197 | 10/1988 | Japan . |
| 1-252303 | 10/1989 | Japan . |
| 2-173264 | 7/1990 | Japan . |
| 3-111573 | 5/1991 | Japan . |
| 3-257088 | 11/1991 | Japan . |
| 3-257176 | 11/1991 | Japan . |
| 6-148908 | 5/1994 | Japan . |

OTHER PUBLICATIONS

Santhanam, A. T. et al., "Cemented Carbides", pp. 950–977. No publication date!

Matsumoto, S. et al., "Vapor Deposition of Diamond Particles from Methane", Japanese Journal of Applied Physics, vol. 21, No. 4, Apr. 1982, pp. L183–L185.

Paisley, M. J., et al., "Cubic Boron Nitride Thin Film Synthesis by Microwave ECR Plasma Chemical Vapor Deposition," Kobe Engineering Reports, Sep. 20, 1991.

*Primary Examiner*—Roy V. King
*Attorney, Agent, or Firm*—Poms, Smith, Lande & Rose Professional Corporation

[57] ABSTRACT

A method for forming thin films of cubic boron nitride on substrates at low pressures and temperatures. A substrate is first coated with polycrystalline diamond to provide a uniform surface upon which cubic boron nitride can be deposited by chemical vapor deposition.

The cubic boron nitride film is useful as a substitute for diamond coatings for a variety of applications in which diamond is not suitable. any tetragonal or hexagonal boron nitride.

The cubic boron nitride produced in accordance with the preceding example is particularly well-suited for use as a coating for ultra hard tool bits and abrasives, especially those intended to use in cutting or otherwise fabricating iron.

10 Claims, 1 Drawing Sheet

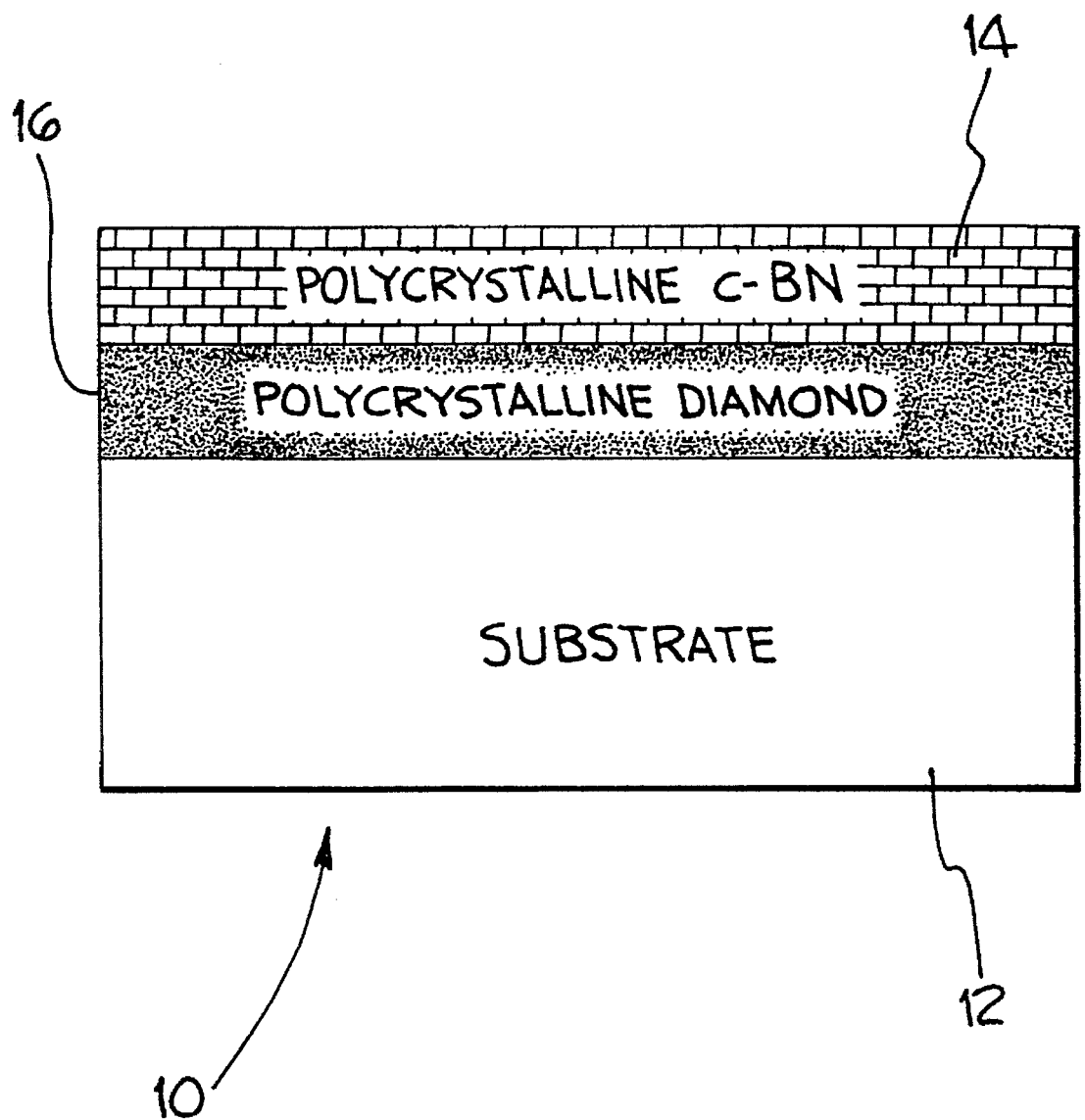

LOW PRESSURE GROWTH OF CUBIC BORON NITRIDE FILMS

This is a continuation of application Ser. No. 08/338,281 filed on Nov. 14, 1994 which is a continuation of Ser. No. 08/180,534 filed on Jan. 12, 1994, which is a continuation of Ser. No. 08/016,132 filed Feb. 10, 1993, all of them now abandoned.

ORIGIN OF INVENTION

The invention described herein was made in the performance of work under a NASA contract, and is subject to the provisions of Public Law 960517 (35 USC 202) in which the Contractor has elected to retain title.

BACKGROUND OF THE INVENTION

1. FIELD OF THE INVENTION

The present invention relates generally to the formation of cubic boron nitride (c-BN) films on substrates such as cutting tools. More particularly, the present invention relates to the formation of such films at low pressure and relatively low temperature.

2. DESCRIPTION OF RELATED ART

C-BN is a very important technological material. It has properties similar to those of diamond: it is chemically inert, thermally highly conducting, and electrically insulating. The material is also known to be the hardest material after diamond. Consequently, c-BN has found uses in many industrial applications ranging from high precision cutting and grinding of ferrous materials to high temperature electronic devices.

Boron nitride is known to have two crystallographic structures in addition to c-BN. These two structures are tetragonal boron nitride (t-BN) and hexagonal boron nitride (h-BN). C-BN is much harder than either of the two alternate crystal structures and therefore is the preferred coating material for ultra hard tools. At present, cubic boron nitride is deposited on various substrates using high pressure (approximately 45–55 kbar) and high temperature (1400°–1700° C.) conditions. In order for c-BN to be used in a wide variety of applications, it is necessary that processes be developed wherein thin films of c-BN can be formed onto a variety of substrates without requiring high pressures and high temperatures.

Attempts to deposit c-BN films at low pressures have not been successful. For example, present low pressure methods have only been able to produce films containing up to 10% c-BN. Accordingly, there is a present need to develop simple and efficient methods for depositing films of cubic boron nitride onto a wide variety of substrates at low pressure and relatively low temperature.

Diamond has also been widely used as a coating material for ultra hard tools and abrasives. Methods have been developed for growing diamond films at reduced temperatures and pressures. However, diamond films are not well-suited for cutting or abrading iron. Diamond is reactive with iron at the high temperatures generated during cutting operations. Cubic boron nitride is especially well-suited as a substitute for diamond in such cutting operations since cubic boron nitride is not attacked by iron. Accordingly, it would be desirable to provide a method for coating tool bits made from tungsten carbide and other hard materials with cubic boron nitride to provide ultra hard tools which are suitable for use in cutting iron.

SUMMARY OF THE INVENTION

In accordance with the present invention, a method is provided for coating a variety of substrates with films of cubic boron nitride at low pressures and relatively low temperatures utilizing chemical vapor deposition. As a feature of the present invention, a layer of diamond is deposited on the substrate prior to vapor deposition of the cubic boron nitride layer. The chemistries between diamond and cubic boron nitride are compatible and it is possible to deposit a layer consisting substantially of cubic boron nitride onto the diamond interlayer under low temperature and low pressure conditions.

The cubic boron nitride films of the present invention are especially well-suited for use as coatings for ultra hard cutting tools wherein diamond-like hardness is required. An additional advantage provided by the present invention is that cubic boron nitride is resistant to attack by iron at the high temperatures generated during cutting and grinding operations.

The method of the present invention involves the steps of depositing diamond onto a substrate utilizing chemical vapor deposition to form a substantially continuous diamond interlayer which covers the substrate. Cubic boron nitride is then applied to the diamond interlayer utilizing low temperature-low pressure chemical vapor deposition. The vapor deposition may be assisted utilizing low energy ion bombardment such as direct current (dc) or radio frequency (RF) biasing. The resulting boron nitride film deposited on the diamond interlayer is composed substantially of cubic boron nitride.

The above discussed and many other features and attendant advantages of the present invention will become better understood by reference to the following detailed description when taken in conjunction with the accompanying drawing.

BRIEF DESCRIPTION OF THE DRAWING

The drawing is a partially schematic cross-sectional representation of a preferred exemplary embodiment of the present invention wherein polycrystalline cubic boron nitride is formed on a substrate which has been previously coated with polycrystalline diamond.

DESCRIPTION OF THE PREFERRED EXEMPLARY EMBODIMENTS

The present invention has wide application to the formation of cubic boron nitride (c-BN) films on a wide variety of substrates. Suitable substrates onto which the c-BN film can be deposited include metals and metal alloys, silicon, quartz, alumina and any other substrate upon which diamond can be deposited. A preferred substrate is tungsten carbide. Tungsten carbide is used in a wide variety of ultra hard tool materials and super abrasives in which diamond is bonded or otherwise imbedded into the tungsten carbide. Details regarding the use of tungsten carbide and diamond coatings as tool bit materials is discussed in "Metals Handbook," 9th Edition, Volume 3, Properties Selection: Stainless Steel Tools and Tool Material, Special Purpose Metals-ASM. Referring to the drawing, an article in accordance with the present invention is shown schematically at 10. The article 10 includes a substrate 12, polycrystalline cubic boron nitride layer 14 and a polycrystalline diamond interlayer 16. The article 10 is preferably a tool bit wherein the substrate 12 is tungsten carbide. Although the preferred exemplary embodiment is a cutting tool for use in fabricating iron wherein cubic boron nitride is deposited on a diamond-treated tungsten carbide substrate, it will be recognized by those skilled in the art that the present invention has wide application to the formation of cubic boron nitride films on any substrate upon which diamond can be deposited as a polycrystalline interlayer or primer coating.

The polycrystalline diamond film 16 is applied to the substrate using any of the known vapor deposition techniques for depositing thin films of diamond. Suitable vapor deposition processes include microwave plasma or hot filament-assisted CVD techniques. An exemplary CVD technique is set forth in "Vapor Deposition of Diamond Particles from Methane", S. Matsumoto, et al., *Japanese Journal of Applied Physics*, Vol. 21, No. 4, April 1982, pp. L183–L185.

The particular CVD process which is utilized to deposit the polycrystalline diamond film is not particularly critical provided that the technique is capable of depositing thin films of polycrystalline diamond on a variety of substrates. The polycrystalline diamond layer 16 shown in the drawing is a diagrammatic representation only so that the relative thickness of the polycrystalline diamond interlayer with respect to the substrate shown in the drawing is not to scale. Preferably, the polycrystalline diamond layer will be as thin as possible while still providing substantially continuous coverage of the surface area of the substrate. Typically, layer thickness will range from between about 2 to 10 microns. The thickness of the diamond layer will vary depending upon the underlying surface characteristics. The polycrystalline layer thickness does not have to be uniform, but should be sufficiently thick so that little if any of the underlying substrate is exposed. In analogy, the diamond layer performs the function of a primer coating which is utilized to impart desirable surface characteristics to the substrate in order to enhance formation of cubic boron nitride during subsequent deposition procedures. Accordingly, it is preferred that the layer be as thin as possible while still providing continuing coverage of the substrate surface.

The diamond layer 16 is preferably polycrystalline and includes crystal sizes ranging from 1–10 microns. The particular crystal size for the crystals in the diamond layer may be varied depending upon the surface characteristics of the underlying substrate and the particular crystal size of cubic boron nitride being deposited.

With respect to the polycrystalline c-BN layer 14, this layer also is preferably formed using chemical vapor deposition techniques. In accordance with the present invention, it was discovered that the pretreatment of the substrate to form a diamond interlayer thereon allows the use of low pressure and low temperature CVD processes to deposit c-BN onto the substrate. The same CVD techniques utilized for growing the diamond interlayer 16 may also be used for forming the polycrystalline cubic boron nitride layer. Suitable CVD processes include electron cyclotron residence (ECR) microwave plasma enhanced techniques or any of the other reactive vapor deposition techniques utilized for depositing diamond films. ECR microwave plasma enhanced CVD is the preferred deposition technique. In general, temperatures in the CVD chamber will range from 400°–1000° C. with pressures ranging up to 100 Torr. This type of low temperature and low pressure CVD system is known to those skilled in the art and the various parameters used to deposit both diamond and cubic boron nitride films can be established by routine experimentation.

The polycrystalline cubic boron nitride layer 14 may be varied in thickness depending upon the particular application. In general, layer thicknesses on the order of 5–20 microns are preferred.

Examples of practice are as follows:

A polycrystalline diamond film is deposited onto a tungsten carbide substrate utilizing microwave ECR plasma chemical vapor deposition as described by M. J. Paisley, et al. in "Cubic Boron Nitride Thin Film Synthesis By Microwave ECR Plasma Chemical Vapor Deposition," Kobe Engineering Reports, Sep. 20, 1991. The basic system and procedure is followed except that a methane/hydrogen reactive gas is introduced into the vapor deposition zone instead of borozene. The diamond deposition is carried out with the amount of methane/hydrogen in the deposition zone being maintained at between 0.5–2% with flow rates of the gas being maintained between 100–500 sccm. Deposition temperatures range from 600°–1000° C. and the pressure within the CVD chamber is maintained at 40–100 Torr. Although RF-biasing can be used to enhance diamond deposition, it is preferred that hot filament-assisted growth be conducted with the filament temperature being maintained at about 2000K. The microwave power is preferably 400–700 W with the microwave frequency being 2.45 GHz.

As is well known, tungsten carbide includes cobalt as a binder for the tungsten particles. Cobalt has the tendency to catalyze the hydrocarbon gas present in the reactive atmosphere into soot. Accordingly, it is preferred that the substrate be etched away prior to diamond growth. Nitric acid is a preferred etching agent. The use of nitric acid to etch substrates to reduce soot generation during CVD growth is known. In addition to etching, the substrate surface is preferably rubbed with sub-micron diamond powders to promote diamond nucleation during the CVD process. If desired, a thin i.e. 0.02 micron buffer layer, such as amorphous silicon, can be deposited onto the substrate to further enhance diamond adhesion. The microwave ECR plasma chemical vapor deposition process is carried out for a sufficient time to apply a 5 micron thick diamond layer which is substantially continuous, i.e. no voids or open areas, which cover the substrate surface area.

After deposition of the diamond interlayer, a layer of cubic boron nitride is then applied to the treated substrate also utilizing microwave ECR plasma chemical vapor deposition. The process conditions for the cubic boron nitride deposition are similar to the diamond or $B_2H_6/NH_3$ deposition except that a $B_2H_6/N_2$ reactive atmospheres is utilized wherein the percentage of $B_2H_6/N_2$ or $B_2H_6/NH_3$ is maintained at between about 0.5 to 1.5%. The flow rate of reactive gases into the reaction vessel is maintained at between about 50–100 sccm and the temperature in the reaction vessel is between 400°–700° C. The pressure in the vessel is controlled to be within 0.5–10 mTorr and the 2.45 GHz microwave is applied again at 400–700 W. The deposition process is carried out for a sufficient time to deposit a layer of cubic boron nitride which is free of voids and includes little if any tetragonal or hexagonal boron nitride.

The cubic boron nitride produced in accordance with the preceding example is particularly well-suited for use as a coating for ultra hard tool bits and abrasives, especially those intended to use in cutting or otherwise fabricating iron.

Having thus described exemplary embodiments of the present invention, it will be understood by those skilled in the art that the preceding description is exemplary only and that various other alternatives, adaptations and variations may be made within the scope of the present invention. The present invention is only limited by the following claims.

We claim:

1. A method for making a tool comprising the steps of:

providing a tool having a tungsten carbide cutting surface;

etching said tungsten carbide cutting surface to form an acid etched surface;

rubbing said acid etched surface with sub-micron diamond powder to form a diamond powder treated surface;

depositing amorphous silicon onto said diamond powder treated surface to form a layer of amorphous silicon thereon;

depositing a sufficient amount of diamond onto said amorphous silicon layer on said tungsten carbide cutting surface by chemical vapor deposition to form a substantially continuous polycrystalline diamond interlayer which covers said tungsten carbide cutting surface; and depositing boron nitride onto said polycrystalline diamond interlayer by chemical vapor deposition at a temperature of between 400° C. and 1000° C. and a pressure of up to 100 Torr to form a polycrystalline coating which consists essentially of cubic boron nitride.

2. A method for making a tool according to claim 1 wherein a sufficient amount of boron nitride is deposited to form a polycrystalline cubic boron nitride coating having a thickness between about 5 to 20 microns.

3. A method for making a tool according to claim 1 wherein the step of forming said polycrystalline diamond interlayer is carried out so as to form diamond crystals having crystal sizes of between 1 to 10 microns.

4. A method for making a tool according to claim 1 wherein the step of forming said polycrystalline cubic boron nitride coating is carried out so as to form cubic boron nitride crystals having crystal sizes of between 1 to 10 microns.

5. A method for making a tool according to claim 3 wherein the step of forming said polycrystalline cubic boron nitride coating is carried out so as to form cubic boron nitride crystals having crystal sizes of between 1 to 10 microns.

6. A method for making a tool comprising the steps of:

providing a tool having a tungsten carbide cutting surface;

etching said tungsten carbide cutting surface with nitric acid;

depositing by chemical vapor deposition a thin buffer layer of amorphous silicon onto said etched tungsten carbide cutting surface;

depositing a sufficient amount of diamond onto said buffer layer of material by electron cyclotron resonance microwave plasma enhanced chemical vapor deposition to form a substantially continuous polycrystalline diamond interlayer which covers said buffer layer of material; and depositing boron nitride onto said polycrystalline diamond interlayer by electron cyclotron resonance microwave plasma enhanced chemical vapor deposition at a temperature of between 400° C. and 1000° C. and a pressure of up to 100 Torr to form a polycrystalline coating which consists essentially of cubic boron nitride.

7. A method for making a tool according to claim 6 wherein a sufficient amount of boron nitride is deposited to form a polycrystalline cubic boron nitride coating having a thickness of between about 5 to 20 microns.

8. A method for making a tool according to claim 6 wherein the step of forming said polycrystalline diamond interlayer is carried out so as to form diamond crystals having crystal sizes of between 1 to 10 microns.

9. A method for making a tool according to claim 6 wherein the step of forming said polycrystalline cubic boron nitride coating is carried out so as to form cubic boron nitride crystals having crystal sizes of between 1 to 10 microns.

10. A method for making a tool according to claim 6 wherein the step of forming said polycrystalline cubic boron nitride coating is carried out so as to form cubic boron nitride crystals having crystal sizes of between 1 to 10 microns.

* * * * *